US009991175B2

(12) United States Patent
Torimi et al.

(10) Patent No.: US 9,991,175 B2
(45) Date of Patent: Jun. 5, 2018

(54) METHOD FOR ESTIMATING DEPTH OF LATENT SCRATCHES IN SIC SUBSTRATES

(71) Applicant: Toyo Tanso Co., Ltd., Osaka-shi, Osaka (JP)

(72) Inventors: Satoshi Torimi, Kanonji (JP); Norihito Yabuki, Kanonji (JP); Satoru Nogami, Kanonji (JP)

(73) Assignee: TOYO TANSO CO., LTD., Osaka-shi (JP)

( * ) Notice: Subject to any disclaimer, the term of this patent is extended or adjusted under 35 U.S.C. 154(b) by 0 days. days.

(21) Appl. No.: 15/300,653

(22) PCT Filed: Mar. 10, 2015

(86) PCT No.: PCT/JP2015/001301
§ 371 (c)(1),
(2) Date: Sep. 29, 2016

(87) PCT Pub. No.: WO2015/151411
PCT Pub. Date: Oct. 8, 2015

(65) Prior Publication Data
US 2017/0110378 A1    Apr. 20, 2017

(30) Foreign Application Priority Data
Mar. 31, 2014    (JP) ................. 2014-074748

(51) Int. Cl.
*H01L 21/00* (2006.01)
*H01L 21/66* (2006.01)
(Continued)

(52) U.S. Cl.
CPC .......... *H01L 22/12* (2013.01); *H01L 21/0201* (2013.01); *H01L 21/02024* (2013.01); *H01L 21/0475* (2013.01); *H01L 29/1608* (2013.01)

(58) Field of Classification Search
CPC .......... C03C 15/02; C30B 33/08; C30B 29/36; H01L 21/02378; H01L 21/302; H01L 22/12
See application file for complete search history.

(56) References Cited

U.S. PATENT DOCUMENTS 3,938,978 A * 2/1976 Hummel ................. C03B 32/02
428/846.9
2002/0042154 A1    4/2002 Nakabayashi et al.
(Continued)

FOREIGN PATENT DOCUMENTS

JP    H06-305862 A    11/1994
JP    2003-234313 A    8/2003
(Continued)

OTHER PUBLICATIONS

Extended European Search Report dated Feb. 17, 2017, issued in counterpart European Patent Application No. 15773355.1. (9 pages).
(Continued)

*Primary Examiner* — Selim Ahmed
*Assistant Examiner* — Evan Clinton
(74) *Attorney, Agent, or Firm* — Westerman, Hattori, Daniels & Adrian, LLP

(57) ABSTRACT

This method for estimating the depth of latent scratches in SiC substrates includes an etching step, a measurement step, and an estimation step. In the etching step, a SiC substrate in which at least the surface is formed from single crystal SiC, and which has been subjected to machining, is subjected to heat treatment under Si atmosphere to etch the surface of the SiC substrate. In the measurement step, the surface roughness or the residual stress of the SiC substrate which has been subjected to the etching step is measured. In the estimation step, the depth of latent scratches or the presence or absence of latent scratches in the SiC substrate
(Continued)

before the etching step are estimated on the basis of the results obtained in the measurement step.

8 Claims, 6 Drawing Sheets

(51) Int. Cl.
  *H01L 21/02* (2006.01)
  *H01L 21/04* (2006.01)
  *H01L 29/16* (2006.01)

(56) References Cited

U.S. PATENT DOCUMENTS

2012/0211769 A1     8/2012  Kusunoki et al.
2016/0111279 A1*    4/2016  Kaneko .................. C30B 29/36
                                                                438/492

FOREIGN PATENT DOCUMENTS

| JP | 2008-16691 A | 1/2008 |
|---|---|---|
| JP | 2011-9661 A | 1/2011 |
| JP | 2012-49392 A | 3/2012 |
| WO | 2011-024931 A1 | 3/2011 |

OTHER PUBLICATIONS

International Search Report dated Jun. 2, 2015, issued in counterpart International Application No. PCT/JP2015/001301 (1 page).

Office Action dated Jul. 5, 2017, issued in counterpart Japanese Patent Application No. 2014-074748, with English translation. (6 pages).

Office Action dated Aug. 21, 2017, issued in counterpart Korean Application No. 10-2016-7022409, with English machine translation. (10 pages).

Office Action dated Dec. 8, 2017, issued in counterpart European Application No. 15773355.1. (7 pages).

Office Action dated Feb. 5, 2018, issued in counterpart Chinese Application No. 201580009990.8, with English translation. (14 pages).

Office Action dated Feb. 28, 2018, issued in counterpart Korean Application No. 10-2016-7022409, with English translation. (6 pages).

* cited by examiner (a)

(b)

METHOD FOR ESTIMATING DEPTH OF LATENT SCRATCHES IN SIC SUBSTRATES

TECHNICAL FIELD

The present invention mainly relates to a method for estimating the depth of latent scratches occurred on a SiC substrate.

BACKGROUND ART

SiC, which is superior to Si, etc., in terms of heat resistance, electrical characteristics and the like, has been attracting attention as a new semiconductor material.

Patent Document 1 discloses a surface treatment method for planarizing a SiC substrate. In the surface treatment method, a storage container is heated while the SiC substrate is stored within the storage container under Si vapor pressure. This results in etching the SiC substrate stored within the storage container, to obtain the SiC substrate that is planar at a molecular level.

Patent Document 2 discloses a treatment method for removing a surface modified layer formed on the SiC substrate. Patent Document 2 describes that the surface modified layer is a damage layer of a crystal structure occurred in a step (mechanical processing such as mechanical polishing) of manufacturing the SiC substrate. In this treatment method, the thickness of the surface modified layer is kept equal to or less than 50 nm and the surface modified layer is removed by hydrogen etching.

PRIOR-ART DOCUMENTS

Patent Documents

PATENT DOCUMENT 1: Japanese Patent Application Laid-Open No. 2008-16691
PATENT DOCUMENT 2: International Publication WO 2011/024931

SUMMARY OF THE INVENTION

Problems to be Solved by the Invention

Here, when formation of an epitaxial layer, heat treatment and the like are performed on a SiC substrate having latent scratches, the latent scratches are exposed and a surface of the SiC substrate is roughened. As a result, a quality of a semiconductor manufactured from the SiC substrate is degraded. Therefore, the latent scratches is preferably removed in advance.

However, since the depth of the latent scratches is changed depending on conditions of the mechanical polishing performed on the SiC substrate, it is difficult to accurately estimate the depth. Too much etching of the SiC substrate in order to surely remove the latent scratches leads to deterioration of yield rate and an increase in treatment time.

The present invention has been made in view of the circumstances described above, and a primary object of the present invention is to provide a method for estimating a depth of latent scratches occurred on a SiC substrate.

Means for Solving the Problems and Effects Thereof

Problems to be solved by the present invention are as described above, and next, means for solving the problems and effects thereof will be described.

In a first aspect of the present invention, a method for estimating a depth of latent scratches on a SiC substrate is provided, as follows. That is, the method for estimating the depth of latent scratches on the SiC substrate includes an etching step, a measurement step, and an estimation step. In the etching step, a SiC substrate made of, at least in its surface, single crystal SiC, after performing mechanical processing is heated under Si atmosphere and thereby the surface of the SiC substrate is etched. In the measurement step, the surface roughness of the SiC substrate in which the etching step is performed is measured. In the estimation step, the depth of latent scratches or the presence or absence of latent scratches in the SiC surface before the etching step are estimated based on the result obtained by the measurement step.

Accordingly, since the depth of latent scratches on the SiC substrate can be estimated, the necessary and sufficient amount of etching can be recognized. Thus, deterioration of yield or increase in the rate of treatment can be prevented while maintaining the quality of the SiC substrate. In the etching by the above-described method, the rate of etching is higher compared with hydrogen etching or chemical mechanical polishing, and therefore the depth of latent scratches can be quickly estimated. Moreover, the surface roughness can be easily measured relatively, and therefore the depth of latent scratches can be easily estimated.

For the method for estimating the depth of latent scratches on the SiC substrate, in the estimation step, if the surface roughness of the SiC substrate after etching is larger than a first threshold value, it is preferably estimated that the depth of latent scratches is deeper than the amount of etching.

Accordingly, since the surface roughness is increased when the latent scratches are remaining after etching, it can be recognized that the latent scratches are remaining.

For the method for estimating the depth of latent scratches on the SiC substrate, in the estimation step, if the surface roughness on the SiC substrate after etching is smaller than a second threshold value, it is preferably estimated that the depth of latent scratches is smaller than the amount of etching.

Accordingly, since the surface roughness is not large if the latent scratches can be removed by etching, measuring the surface roughness can be recognized that the latent scratches can be removed.

In the method for estimating the depth of the latent scratches on the SiC substrate, at least one of the amount of etching in the etching step and the threshold value in the estimation step is preferably determined based on the surface roughness before etching.

Accordingly, since a relationship between the amount of etching and the surface roughness (that is, the depth of latent scratches) is associated with the surface roughness of the SiC substrate before the etching step, the depth of latent scratches can be appropriately estimated by changing the threshold value in the amount of etching based on the surface roughness.

In the method for estimating the depth of the latent scratches on the SiC substrate, the amount of etching is preferably 0.5 µm or more and 10 µm or less.

Accordingly, the depth of latent scratches can be estimated in view of a range where the latent scratches are normally occurred. In the hydrogen etching or chemical mechanical polishing or the like, it takes a lot of time for etching for about 10 µm. In this respect, the etching time can be considerably reduced by etching under Si atmosphere.

For the method for estimating the depth of the latent scratches on the SiC substrate, in the etching step, the rate of etching of the SiC substrate is preferably controlled by adjusting the inert gas pressure around the SiC substrate.

Accordingly, since the rate of etching can be lower compared with that of the etching under Si atmosphere in high vacuum, the amount of etching can be accurately recognized. Therefore, the depth of latent scratches can be accurately estimated.

In a second aspect of the present invention, a method for estimating a depth of latent scratches of a SiC substrate is provided, as follows. That is, the method for estimating the depth of latent scratches on the SiC substrate includes a measurement step and an estimation step. In the measurement step, the residual stress is measured on a SiC substrate made of, at least in its surface, single crystal SiC, after performing mechanical processing. In the estimation step, the depth of latent scratches or the presence or absence of latent scratches are estimated based on the result obtained by the measurement step.

For the method for estimating the depth of the latent scratches on the SiC substrate, in the estimation step, if the residual stress of the SiC substrate is larger than a predetermined amount, it is preferably estimated that the depth of latent scratches is deeper than the amount of etching.

For the method for estimating the depth of the latent scratches on the SiC substrate, in the estimation step, the residual stress of the SiC substrate is lower than a predetermined amount, it is preferably estimated that the depth of latent scratches is shallower than the amount of etching.

As described above, the depth of latent scratches can be estimated without measuring the surface roughness.

For the method for estimating the depth of the latent scratches on the SiC substrate, in the measurement step, the residual stress of the SiC substrate using Raman spectroscopy is preferably measured.

Accordingly, since the residual stress can be measured by non-destructive inspection, the SiC substrate in which the depth of latent scratches has estimated can be shipped. The total inspection of the SiC substrates can be achieved.

EMBODIMENT FOR CARRYING OUT THE INVENTION

Next, an embodiment of the present invention will be described with reference to the drawings.

Figure 1:
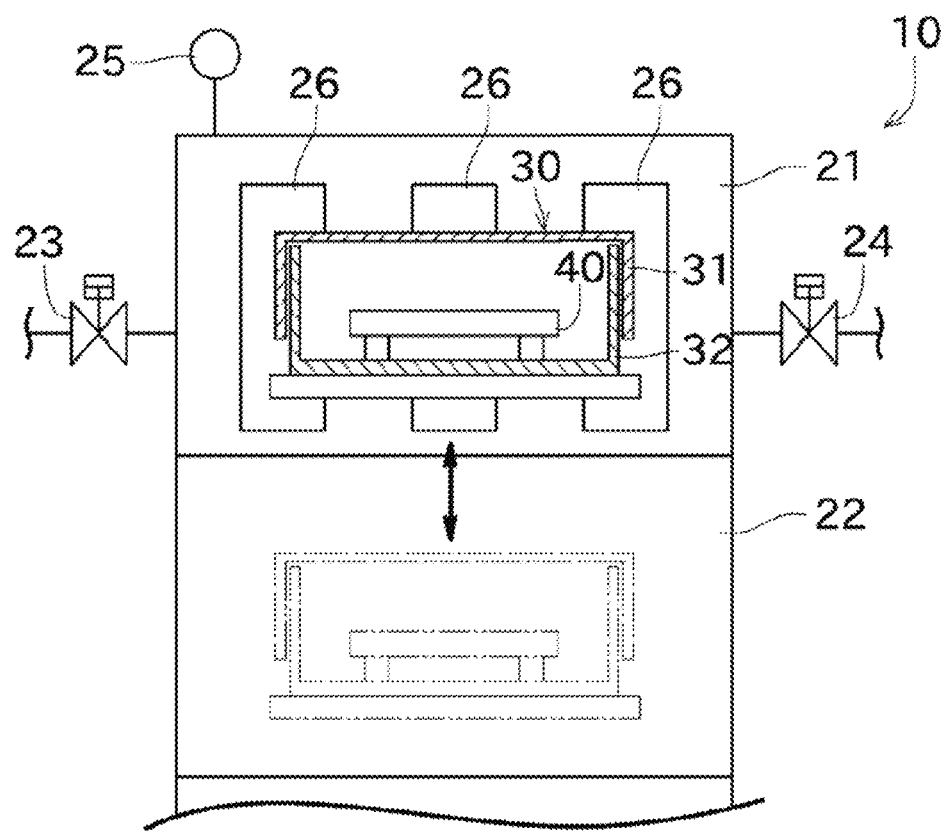
FIG. 1 A diagram for illustration of an outline of a high-temperature vacuum furnace for use in etching according to the present invention.

Firstly, a high-temperature vacuum furnace 10 that is used in a heat treatment of this embodiment will be described with reference to FIG. 1. FIG. 1 is a diagram for illustration of an outline of a high-temperature vacuum furnace for use in a surface treatment method according to the present invention.

As shown in FIG. 1, the high-temperature vacuum furnace 10 includes a main heating chamber 21 and a preheating chamber 22. The main heating chamber 21 is configured to heat a SiC substrate made of, at least in its surface, single crystal SiC, up to a temperature of 1000° C. or more and 2300° C. or less. The preheating chamber 22 is a space for preheating the SiC substrate prior to heating of the SiC substrate in the main heating chamber 21.

A vacuum-forming valve 23, an inert gas injection valve 24, and a vacuum gauge 25 are connected to the main heating chamber 21. The vacuum-forming valve 23 is configured to adjust the degree of vacuum of the main heating chamber 21. The inert gas injection valve 24 is configured to adjust pressure of an inert gas (for example, Ar gas) contained in the main heating chamber 21. The vacuum gauge 25 is configured to measure the degree of vacuum within the main heating chamber 21.

Heaters 26 are provided in the main heating chamber 21. Heat reflection metal plates (not shown) are secured to side walls and a ceiling of the main heating chamber 21. The heat reflection metal plates are configured to reflect heat of the heaters 26 toward a central region of the main heating chamber 21. This provides strong and uniform heating of the SiC substrate, to cause a temperature rise up to 1000° C. or more and 2300° C. or less. Examples of the heaters 26 include resistive heaters and high-frequency induction heaters.

The SiC substrate is heated while stored in a crucible (storing container) 30. The crucible 30 is placed on an appropriate support or the like, and the support is movable at least in a range from the preheating chamber to the main heating chamber.

The crucible 30 includes an upper container 31 and a lower container 32 that are fittable with each other. The crucible 30 is made of tantalum metal, and includes a tantalum carbide layer that is exposed to an internal space of the crucible 30. Si as a Si supply source with proper form is placed in the crucible 30. Any shape or material is adoptable for the container.

To perform a heat treatment on the SiC substrate, as indicated by a chain line in FIG. 1, the crucible 30 is placed in the preheating chamber 22 of the high-temperature vacuum furnace 10, and preheated at a proper temperature (for example, about 800° C.). Then, the crucible 30 is moved into the main heating chamber 21 in which the temperature has been preliminarily raised to a set temperature (for example, about 1800° C.), and thereby the SiC substrate is heated. The preheating may be omitted.

Figure 2:
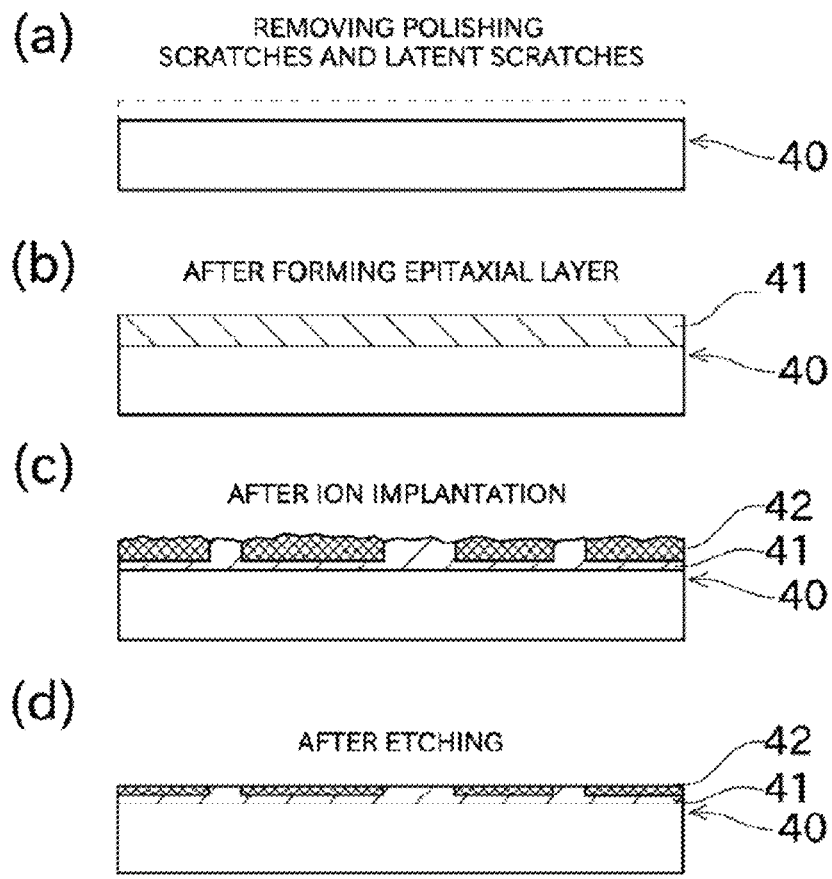
FIG. 2 Diagrams schematically showing the appearance of a substrate in each step for processing the SiC substrate and manufacturing a semiconductor element.

Next, referring to FIG. 2, latent scratches occurred on the SiC substrate 40 and its effect will be described with each step of manufacturing a semiconductor element from the SiC substrate 40.

A bulk substrate used for manufacturing a semiconductor device can be obtained by cutting an ingot made of 4H—SiC single crystal or 6H—SiC single crystal in a predetermined thickness. The bulk substrate having an off angle can be obtained by obliquely cutting the ingot. Then, the mechanical polishing is performed for removing the surface roughness of the bulk substrate. However, the pressure is applied to the inside of the bulk substrate by performing the mechanical polishing, which causes a modified layer (latent scratch) in which the crystallinity is changed.

Next, as shown in FIG. 2(a), the surface of the SiC substrate 40 is etched by using the high-temperature vacuum furnace 10. The etching is performed by heating the SiC substrate stored in the crucible 30 under Si vapor pressure (under Si atmosphere) in an environment of 1500° C. or more and 2200° C. or less, and desirably 1800° C. or more and 2000° C. or less. As a result of heating under Si vapor pressure, SiC of the SiC substrate 40 is sublimated into $Si_2C$ or $SiC_2$, and Si under Si atmosphere and C are bonded on the surface of the SiC substrate 40. This leads to self-organization and planarization of the surface.

Accordingly, the surface of the SiC substrate 40 can be planarized at a molecular level while etching the surface of the SiC substrate 40. The polishing scratches and latent scratches caused by mechanical polishing can be removed by performing the etching.

Next, as shown in FIG. 2(b), an epitaxial layer 41 is formed on the SiC substrate 40. The vapor phase epitaxy process, CVD process or the like may be adoptable for forming an epitaxial layer. If the latent scratches are remaining in the SiC substrate 40, the surface may be roughened due to the effect of latent scratches when forming the epitaxial layer.

Then, the ion implantation is performed on the whole or a part of the surface of the SiC substrate 40 having the epitaxial layer 41 formed thereon. As shown in FIG. 2(c), as a result of the ion implantation, the surface of the epitaxial layer 41 including the ion-implanted portions 42 is roughened.

Then, a treatment for activating the implanted ions and etching of the ion-implanted regions 42 and the like are performed. In this embodiment, these two processes can be performed in a single step. More specifically, a heat treatment (annealing) is performed under Si vapor pressure (under Si atmosphere) in an environment of 1500° C. or more and 2200° C. or less and desirably 1600° C. or more and 2000° C. or less. This can activate the implanted ions. Additionally, the surface of the SiC substrate 40 is etched so that the roughened portions of the ion-implanted regions 42 are planarized (see FIG. 2(d)). If the latent scratches are remaining in the SiC substrate 40, the surface may be roughened due to the effect of latent scratches when performing heat treatment.

The above-described process enables the surface of the SiC substrate 40 to obtain a sufficient flatness and electrical activity. The surface of the SiC substrate 40 can be used to manufacture a semiconductor element.

As described above, if the removal of latent scratches (FIG. 2(a)) is insufficient, the surface of the SiC substrate 40 is roughened in the following steps (FIG. 2(b) or FIG. 2(d)). The applicant performs the following experiment for establishing a method for estimating the depth of latent scratches. This experiment will be described with reference to FIG. 3 to FIG. 5.

In this experiment, four types of SiC substrates, whose surface is Si-face, made of 4H—SiC having an off angle of 4° are heated under Si vapor pressure using the above-described high temperature vacuum furnace 10. Each of the SiC substrates has various surface roughness after mechanical polishing (initial surface roughness) of 1.4 nm, 0.4 nm, 0.3 nm, and 0.1 nm. The heat treatment is performed under high vacuum (about $10^{-5}$ to $10^{-4}$ Pa), and in a temperature range of 1800° C. to 2000° C.

Figure 3:
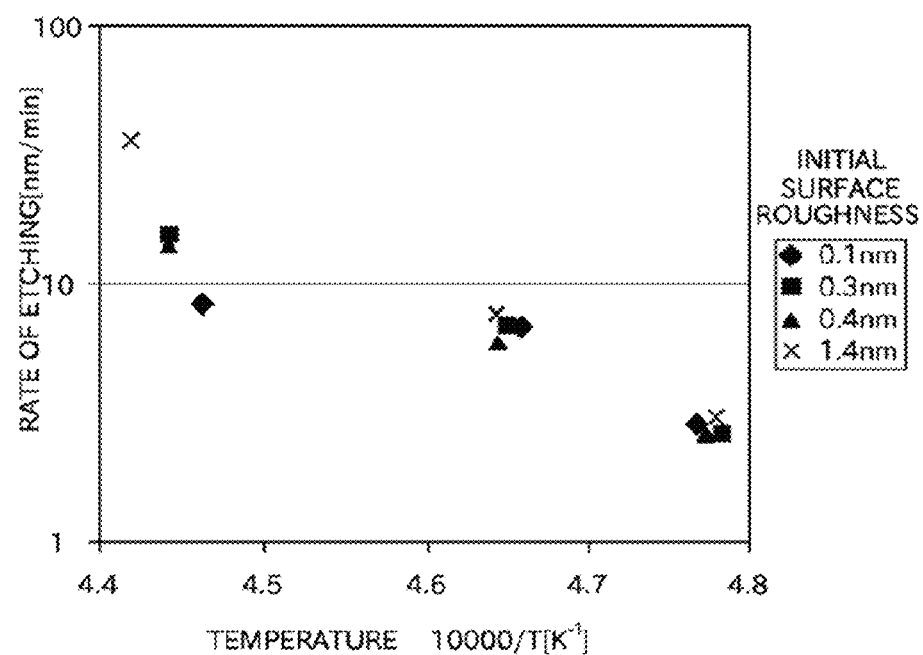
FIG. 3 A graph showing a result that a relationship between the rate of etching and the heating temperature is measured in each of the SiC substrates having various surface roughness.

FIG. 3 is a graph showing a result of measuring a relationship between the rate of etching and the heating temperature in each of the SiC substrates having various surface roughness. FIG. 3 shows the correlation between the initial surface roughness and the rate of etching in a region at 1900° C. or more. Thus, the rate of etching is higher as the surface roughness is larger.

Figure 4:
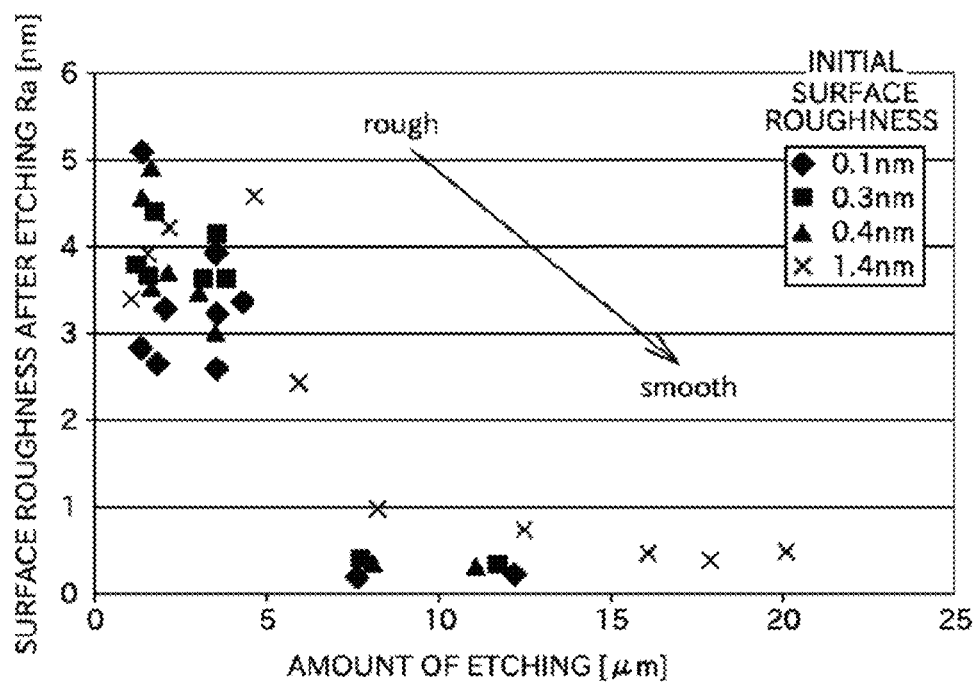
FIG. 4 A graph showing a result of measuring a relationship between the amount of etching and the surface roughness after etching.

FIG. 4 is a graph showing a result of measuring a relationship between the amount of etching and the surface roughness after etching for each of SiC substrate having a different initial surface roughness. When the amount of etching is around 1 μm to 4 μm, the surface roughness Ra was 2.5 nm or more that is considerably increased rather than the surface roughness after mechanical processing. It can be seen that the latent scratches were obviously appeared and the surface was roughened. As a result, the surface roughness is measured after performing the etching in the amount of etching of 0.5 μm to 4 μm, desirably 1 μm to 3 μm. Thereby, it can be confirmed that whether or not the latent scratches are existing on the SiC substrate after the etching.

FIG. 4 shows that a smooth surface having the surface roughness of 1 nm or less can be obtained when the amount of etching is 10 μm or more by further etching which leads to lowering of the surface roughness. It would be because that the latent scratches are removed by the etching. In this result, it can be seen that the latent scratches have not existed from the beginning or the latent scratches have removed.

The change of the surface roughness is varied depending on the initial surface roughness. For example, even in the SiC substrate having the largest initial surface roughness of 1.4 nm, the peak surface roughness is not necessarily larger than that of other SiC substrates having various surface roughness. The SiC substrate having the initial surface roughness of 1.4 nm has the larger surface roughness than that of other SiC substrates. In FIG. 4, since the timing of lowering of the surface roughness is varied even if the initial surface roughness is identical, it can be found that the depth of latent scratches are varied in accordance with the various conditions.

Figure 5:
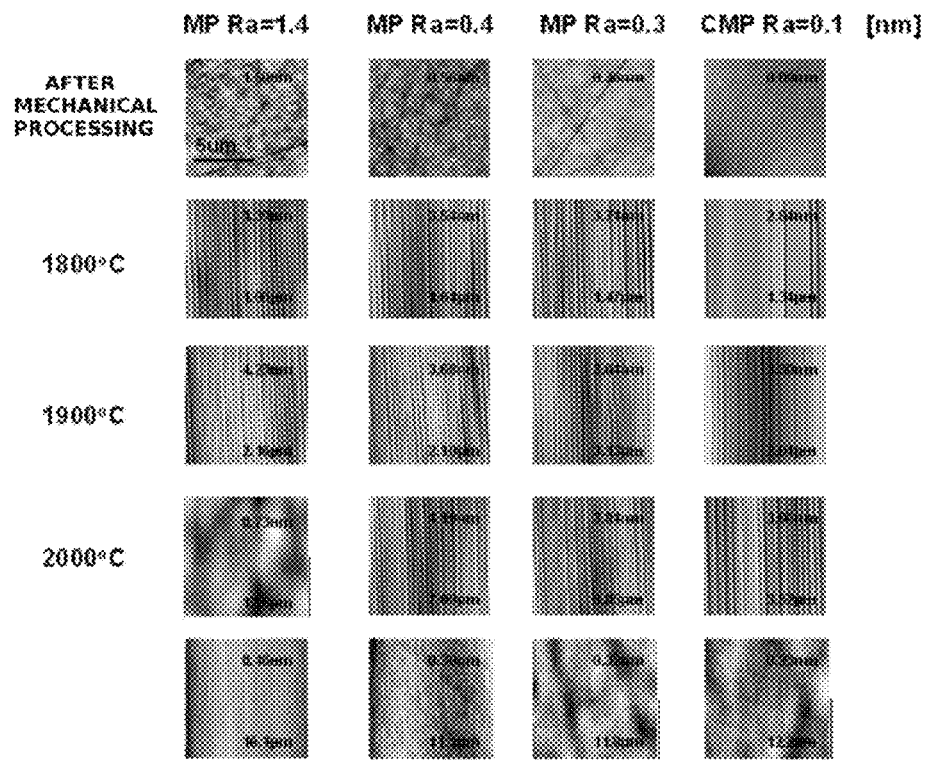
FIG. 5 Photomicrographs of the surface of the SiC substrate after the mechanical processing and the etching are performed.

FIG. 5 contains photomicrographs of the surface of the SiC substrate after the mechanical processing and the etching are performed. The value written in the upper right corner indicates the surface roughness, and the value written in the lower right corner indicates the amount of etching. In FIG. 5, SiC substrates having the same initial surface roughness are arranged in the same column. Specifically, from left to right, the initial surface roughness is 1.4 nm, 0.4 nm, 0.3 nm, and 0.1 nm. In the SiC substrate having the initial surface roughness of 0.1 nm, its surface is treated by chemical mechanical polishing. In other SiC substrates, their surfaces are treated by mechanical polishing.

In FIG. 5, SiC substrates under the same treatment conditions are arranged in the same row, specifically from top to bottom, the SiC substrates after mechanical processing (after mechanical polishing or chemical mechanical polishing), after etching at 1800° C., after etching at 1900° C., after etching at 2000° C., and after further etching at 2000° C.

FIG. 5 shows that etching after mechanical processing results in the occurrence of roughness (step bunching) on the surface, and thereby the surface is then roughened. It can be also found that the step bunching is removed when the amount of etching exceeds 10 μm.

Figure 6:
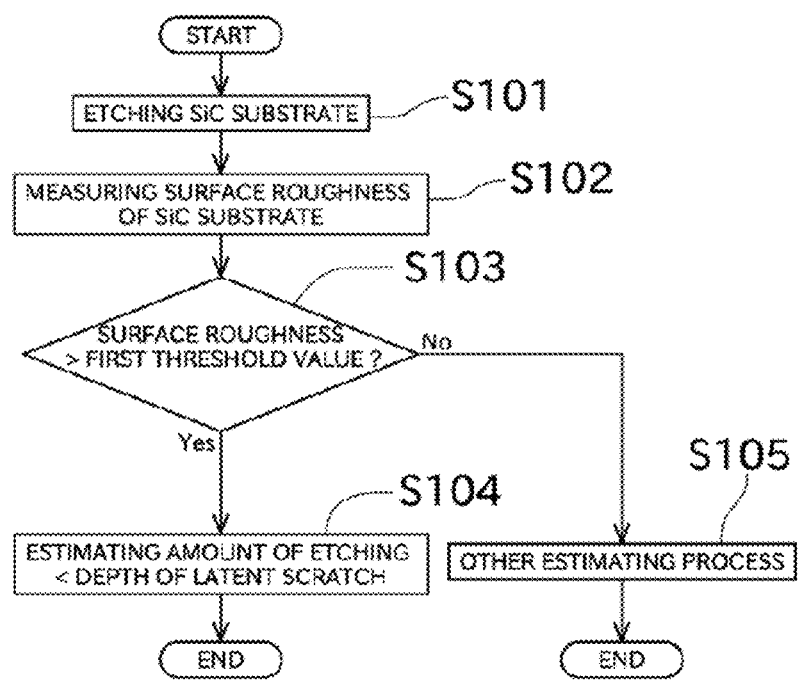
FIG. 6 A flowchart showing a process for estimating the depth of latent scratches on the SiC substrate.
Figure 6:
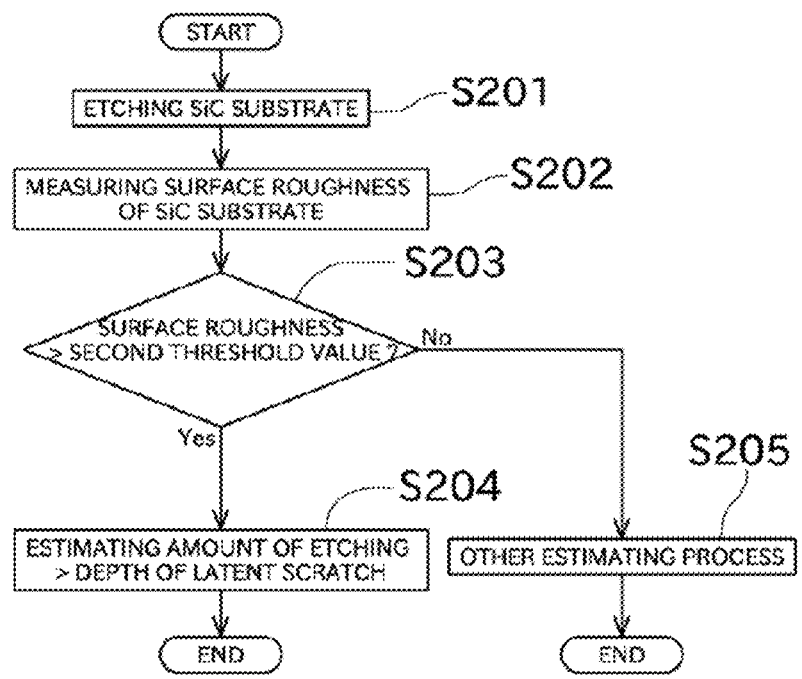
Figure 7:
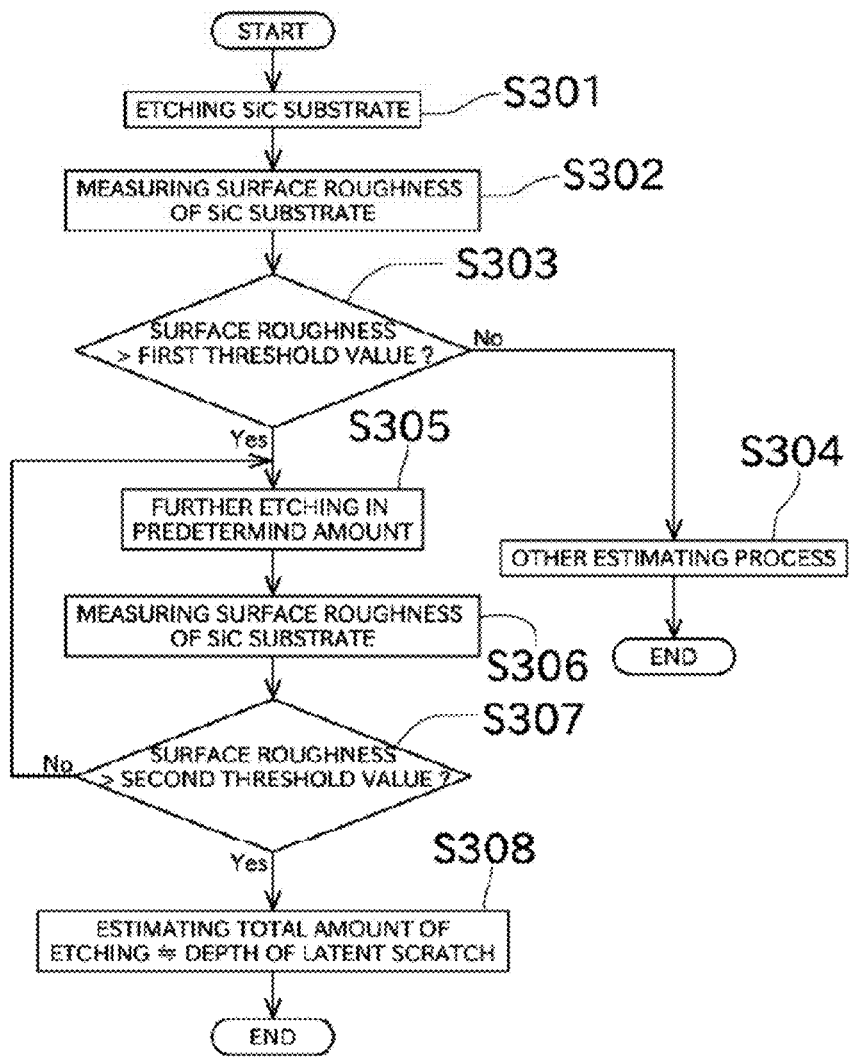
FIG. 7 A flowchart showing another process for estimating the depth of latent scratches on the SiC substrate.
Figure 8:
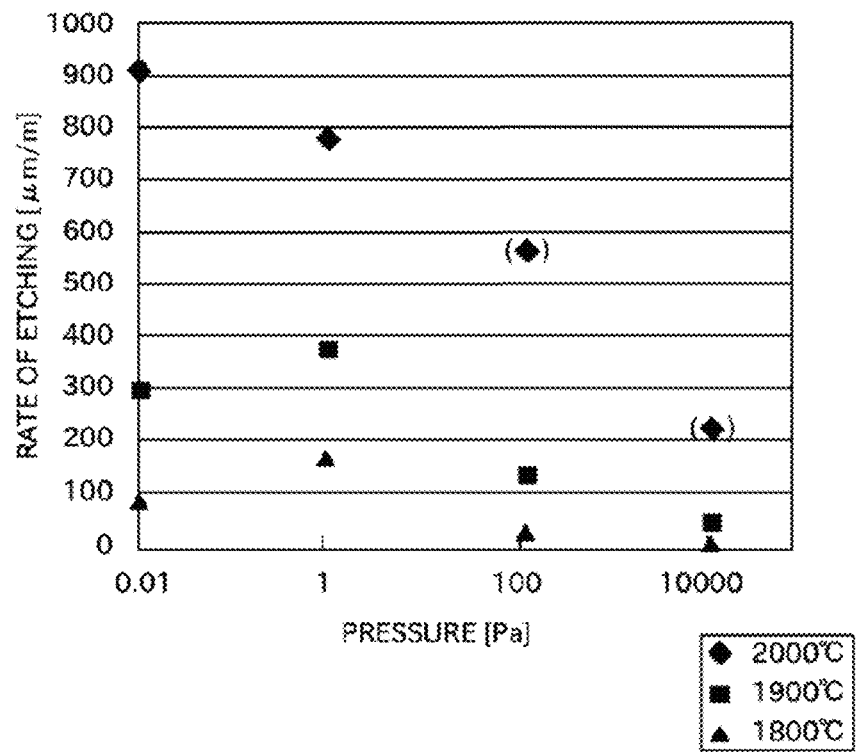
FIG. 8 A graph showing a result of measuring a relationship between the inert gas pressure and the rate of etching.

Next, in consideration of the measurement result of the above-described experiment, a process (estimation process) for estimating the depth of latent scratches of the SiC substrate 40 will be described with reference to FIG. 6 to FIG. 8. In this embodiment, three estimation processes will be described, but these are merely an example. Although it will be described that the operator may use the machinery in each step of the estimation processes, not the operator but the computer may automatically perform in the whole or part of steps.

Firstly, a first estimation process will be described. The operator sets the SiC substrate that is an estimation object in the high temperature vacuum furnace 10. The surface of the SiC substrate is etched by heating under Si vapor pressure (S101). The amount of etching in etching performed at S101 may be defined in accordance with the initial surface roughness or other conditions. Specifically, the amount of etching is 0.5 µm to 4 µm, preferably 1 µm to 3 µm.

Next, the operator measures the surface roughness of the SiC substrate after etching (S102). Any method may be adoptable for measuring the surface roughness, for example, AFM (atomic force microscope) may be used.

Then, the operator determines whether or not the surface roughness obtained by measuring is larger than a first threshold value (S103). The first threshold value is the value for detecting that the surface roughness is increased by the effect of the latent scratches, as described above. Therefore, the first threshold value is preferably about 2 nm to 5 nm. The first threshold value may be determined depending on the initial surface roughness.

When the surface roughness is larger than the first threshold value, it can be estimated that the depth of latent scratches is deeper than the amount of etching in etching performed at S101 (S104). Simultaneously, it can be also estimated that the latent scratches existed on the SiC substrate. Since the single estimation process can estimate merely the rough depth of latent scratches, the same process may be re-performed with the different amount of etching.

If the surface roughness is smaller than the first threshold value, other estimation processes are performed. For example, the same process can be re-performed with the different amount of etching or a second estimation process can be performed.

Next, the second estimation process will be described.

The operator performs the etching of the surface of the SiC substrate (S201) in the same way as described above, and measures the surface roughness (S202). Then, the operator determines whether or not the surface roughness obtained by measuring is smaller than the second threshold value (S203). The second threshold value is the value for detecting that the surface roughness increased by the effect of the latent scratches, as described above, is lowering again. Therefore, the amount of etching is preferably, for example, around 5 µm to 10 µm and the second threshold value is preferably around 0.5 nm to 2 nm. The amount of etching at S201 and the second threshold value can be determined depending on the initial surface roughness.

In a case that the surface roughness is smaller than the second threshold value, it can be estimated that the depth of latent scratches is shallower than the amount of etching (S204). In a case that the latent scratches are less likely to exist on the SiC substrate, it may be estimated that the latent scratches are not existing or the depth of latent scratches is shallower than the amount of etching performed at S102. As such, the depth of latent scratches of the SiC substrate can be estimated. Since the single estimation process can estimate merely the rough depth of latent scratches, the same process may be performed to other substrates with the different amount of etching.

In a case that the surface roughness is larger than the second threshold value, other estimation process is performed (S205). For example, the same process can be re-performed with the different amount of etching, or the first estimation process can be performed.

Next, a third estimation process will be described.

The third estimation process is the estimation process in which the first estimation process and the second estimation process are combined. The operator performs the etching of the surface of the SiC substrate in the same way as described above (S301), and then the surface roughness is measured (S302). The operator determines whether or not the surface roughness obtained by measuring is larger than the first threshold value (S303). When the surface roughness is smaller than or equal to the first threshold value, other estimation process is performed (S304), for example, the same process is performed with the different amount of etching.

On the other hand, When the surface roughness is larger than the first threshold value, the etching is further performed at a predetermined amount (S305). The amount of etching at this time is preferably very small. The operator performs to re-measure the surface roughness of the SiC substrate (S306), and then determines whether or not the obtained surface roughness is smaller than the second threshold value (S307). If the surface roughness is larger than or equal to the second threshold value, the etching (S305) and measuring of the surface roughness (S306) are re-performed and then the above-described determination is re-performed (S307).

If the surface roughness is smaller than the second threshold value, the depth of the SiC substrate when the surface roughness is lowering by performing the etching can be estimated. Therefore, the operator estimates that this depth (total amount of etching) is substantially identical to the depth of latent scratches (S308). As such, in the third estimation process, not a relative depth of latent scratches but an absolute depth can be estimated.

The above-described three estimation processes presuppose that the etching can be performed up to 10 µm and the amount of etching can be accurately controlled. Here, in Patent Document 2, since the rate of etching by hydrogen etching is considerably low (around several tens of nm/h to several hundreds of nm/h), it takes a lot of time for removing the latent scratches. On the other hand, the rate of etching is too high when the etching under Si atmosphere is performed under high vacuum, and therefore it is difficult to accurately control the amount of etching.

In consideration of the above, in this embodiment, the etching can be performed under Si atmosphere while changing the inert gas pressure and controlling the rate of etching. Here, FIG. 8 is a graph showing a relationship between the inert gas pressure and the rate of etching. Specifically, the graph shows the obtained rate of etching when the inert gas pressure is varied in 0.01 Pa, 1 Pa, 133 Pa, and 13.3 kPa under the environment of heating temperature of 1800° C., 1900° C., and 2000° C. An object to be treated is a 4H—SiC substrate having an off angle of 4°. As shown in FIG. 8, basically, the rate of etching tends to be lowering as the inert gas pressure is increasing.

As such, since the rate of etching is prevented from becoming too high, the amount of etching can be accurately controlled. Therefore, the depth of latent scratches can be accurately determined.

As described above, the method for estimating the depth of latent scratches of the SiC substrate 40 includes the etching step, the measurement step, and the estimation step. In the etching step, the SiC substrate 40 made of, at least in its surface, single crystal SiC, after performing mechanical processing is heated under Si atmosphere and thereby the surface of the SiC substrate 40 is etched. In the measurement step, the surface roughness of the SiC substrate 40 on which the etching step is performed is measured. In the estimation step, the depth of latent scratches or the presence or absence of latent scratches are estimated based on the result obtained by the measurement step.

Accordingly, since the depth of latent scratches on the SiC substrate 40 can be estimated, the necessary and sufficient amount of etching can be recognized. Thus, deterioration of yield or increase in the rate of treatment can be prevented while maintaining the quality of the SiC substrate 40. In the etching by the above-described method, the rate of etching is higher compared with hydrogen etching or chemical mechanical polishing, and therefore the depth of latent scratches can be quickly estimated.

In the estimation step of this embodiment, if the surface roughness of the SiC substrate 40 after the etching is larger than the first threshold value, it is estimated that the depth of latent scratches is deeper than the amount of etching.

Accordingly, since the surface roughness is increased when the latent scratches are remained after the etching, measuring of the surface roughness can recognize that the latent scratches are remaining.

In the estimation step of this embodiment, if the surface roughness of the SiC substrate 40 after the etching is smaller than the second threshold value, it is estimated that the depth of latent scratches is shallower than the amount of etching.

Accordingly, since the surface roughness is not increasing if the latent scratches can be removed by performing the etching, measuring of the surface roughness can recognize that the latent scratches are removed.

In the etching step of this embodiment, the rate of etching on the SiC substrate 40 is controlled by adjusting the inert gas pressure around the SiC substrate 40.

Accordingly, since the rate of etching can be lower compared with that of the etching under Si atmosphere in high vacuum, the amount of etching can be accurately recognized. Therefore, the depth of latent scratches can be accurately estimated.

Figure 9:
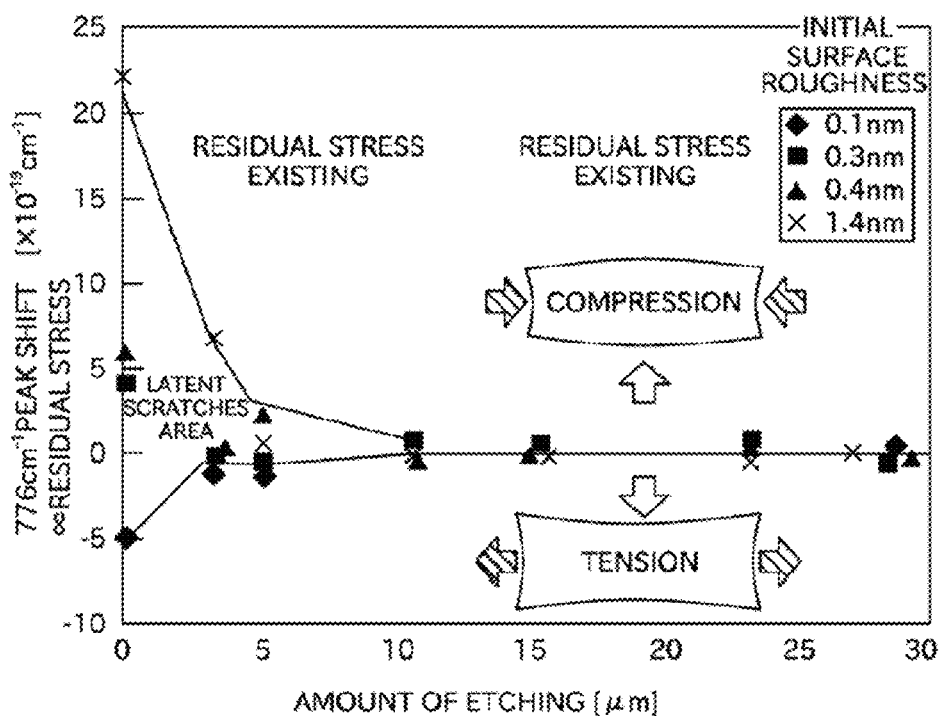
FIG. 9 A graph showing a result of measuring the residual stress by using Raman spectroscopy.

Next, a modification of the above-described embodiment will be described. FIG. 9 is a measurement result of a peak shift in Raman spectroscopy when the etching in the predetermined amount is performed as with FIG. 4. Specifically, Raman spectroscopy is, in a wafer in a backscattering geometry, to measure a peak of 776 cm$^{-1}$ in 4H—SiC FTO mode using Ar laser having wavelength of 532 nm as a light source, and then to measure a peak shift depending on the amount of displacement of the peak from the position of the original 776 cm$^{-1}$. Although the residual stress is occurred in the wafer by changing the crystal structure caused from the stress due to the mechanical processing, measuring the peak shift $\Delta\omega$ can estimate the residual stress near the surface of the wafer according to the principle that "the residual stress $\sigma$ has approximate linear characteristics to the peak shift, $\sigma = A \times \Delta\omega$, and A is a constant."

Before etching (when the amount of etching is 0), it can be seen that the peak shift is positioned at a numerical value considerably away from 0 and the relatively large residual stress is existing. Thus, existence of latent scratches on the SiC substrate can be detected by non-destructive inspection. Similarly to FIG. 4 as described above, it can be seen that the peak shift is considerably reduced by etching of 5 μm or more and the latent scratches are removed. In a case of large amount of etching (specifically in a case of 10 μm or more), similarly to FIG. 4, the peak shift is reduced and then the latent scratches are further removed by etching of 10 μm or more.

A relationship between the amount of etching and the residual stress is similar to the relationship between the amount of etching and the surface roughness. Therefore, the depth of latent scratches can be estimated using the residual stress. Specifically, it is estimated that the depth of latent scratches is deeper than the amount of etching if the residual stress is remaining at a time of measuring the residual stress after the etching, and it is determined that the depth of latent scratches is shallower than the amount of etching if the residual stress is 0. The method for measuring the residual stress is not limited to Raman spectroscopy. An appropriate method can be used.

Although a preferred embodiment and a modification of the present invention has been described above, the above-described configuration can be modified, for example, as follows.

The above-described flowchart is merely illustrative one. The process order may be changed and the process may be added or deleted. Any estimation method is adoptable as long as the depth of latent scratches is estimated based on the surface roughness or the residual stress after the etching.

Any method is adoptable for adjusting the inert gas. An appropriate method can be used. During the etching step, the inert gas pressure may be kept constant or may be varied. Varying the inert gas pressure may be employed in a case of, for example, initially setting the high rate of etching and then lowering the rate of etching for fine adjustment.

The environment of the processing, the single crystal SiC substrate used, and the like, are merely illustrative ones, and the present invention is applicable to various environments and various types of single crystal SiC substrates. For example, the heating temperature is not limited to the temperature illustrated above, and a lower heating temperature enables further lowering of the rate of etching. Moreover, a heating apparatus other than the above-described high-temperature vacuum furnace is adoptable.

DESCRIPTION OF THE REFERENCE NUMERALS 10 high-temperature vacuum furnace
21 main heating chamber
22 preheating chamber
30 crucible
40 SiC substrate

The invention claimed is:
1. A method for estimating a depth of latent scratches of a SiC substrate comprising:
   an etching step of etching a surface of the SiC substrate by performing heat treatment under Si atmosphere after performing mechanical processing, the SiC substrate made of, at least in the surface thereof, single crystal SiC;
   a measurement step of measuring a surface roughness of the SiC substrate in which the etching step has been performed; and
   an estimation step of estimating, based on a result obtained in the measurement step, the depth of latent scratches or the presence or absence of latent scratches of the SiC substrate that occurred before the etching step, wherein in the estimation step, in a case that the surface roughness of the SiC substrate after the etching is larger than a first threshold value, it is estimated that the depth of latent scratches is deeper than the amount of etching, and in the estimation step, in a case that the surface roughness of the SiC substrate after the etching is smaller than a second threshold value that is smaller than the first threshold value, it is estimated that the depth of latent scratches is shallower than the amount of etching.

2. The method for estimating the depth of latent scratches of the SiC substrate according to claim 1, wherein the amount of etching in the etching step and at least one of the threshold values in the estimation step is determined based on the surface roughness before performing the etching.

3. The method for estimating the depth of latent scratches of the SiC substrate according to claim 1, wherein in the etching step, the amount of etching is 0.5 μm or more and 10 μm or less.

4. The method for estimating the depth of latent scratches of the SiC substrate according to claim 1, wherein in the etching step, a rate of etching of the SiC substrate is controlled by adjusting the inert gas pressure around the SiC substrate.

5. The method for estimating the depth of latent scratches of the SiC substrate according to claim 1, wherein the amount of etching in the etching step and at least one of the threshold values in the estimation step is determined based on the surface roughness before performing the etching.

6. A method for estimating a depth of latent scratches of a SiC substrate after performing mechanical processing, the SiC substrate made of, at least in the surface thereof, single crystal SiC, the method comprising:

an etching step of etching a surface of the SiC substrate by performing heat treatment under Si atmosphere;

a measurement step of measuring a residual stress of the SiC substrate in which the etching step has been performed; and an estimation step of estimating, based on a result obtained in the measurement step, the depth of latent scratches of the SiC substrate or the presence or absence of latent scratches that occurred before the etching step, wherein in the estimation step, in a case that the residual stress of the SiC substrate is larger than a predetermined amount, it is estimated that the depth of latent scratches is deeper than the amount of etching.

7. A method for estimating a depth of latent scratches of a SiC substrate after performing mechanical processing, the SiC substrate made of, at least in the surface thereof, single crystal SiC, the method comprising:

an etching step of etching a surface of the SiC substrate by performing heat treatment under Si atmosphere;

a measurement step of measuring a residual stress of the SiC substrate in which the etching step has been performed; and an estimation step of estimating, based on a result obtained in the measurement step, the depth of latent scratches of the SiC substrate or the presence or absence of latent scratches that occurred before the etching step, wherein in the estimation step, in a case that the residual stress of the SiC substrate is smaller than a predetermined amount, it is estimated that the depth of latent scratches is shallower than the amount of etching.

8. The method for estimating the depth of latent scratches of the SiC substrate according to claim 6, wherein in the measurement step, the residual stress of the SiC substrate is measured using Raman spectroscopy.

* * * * *